United States Patent
Yahav

(10) Patent No.: US 8,543,072 B1
(45) Date of Patent: Sep. 24, 2013

(54) HIGH ACCURACY PROGRAMMABLE GAIN AMPLIFIER

(75) Inventor: Nir Yahav, Holon (IL)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/336,499

(22) Filed: Dec. 23, 2011

Related U.S. Application Data

(62) Division of application No. 12/197,764, filed on Aug. 25, 2008, now Pat. No. 8,090,334.

(60) Provisional application No. 60/971,335, filed on Sep. 11, 2007.

(51) Int. Cl.
*H01Q 11/12* (2006.01)
*H04B 1/04* (2006.01)

(52) U.S. Cl.
USPC .............. 455/127.1; 455/550.1; 330/297

(58) Field of Classification Search
USPC .......... 455/127.1–127.3, 550.1, 552.1, 553.1; 330/10, 297
See application file for complete search history.

(56) References Cited

U.S. PATENT DOCUMENTS

| | | | |
|---|---|---|---|
| 5,239,695 A * | 8/1993 | Jung | 455/126 |
| 5,969,568 A * | 10/1999 | Vester | 327/560 |
| 6,313,698 B1 * | 11/2001 | Zhang et al. | 330/51 |
| 7,327,194 B2 | 2/2008 | Li | |
| 7,365,597 B2 | 4/2008 | Forbes | |
| 7,498,858 B2 | 3/2009 | Desai et al. | |
| 7,859,340 B2 | 12/2010 | Miao et al. | |
| 7,860,454 B2 | 12/2010 | Moloudi et al. | |
| 2008/0057883 A1 * | 3/2008 | Pan | 455/127.1 |
| 2009/0252122 A1 * | 10/2009 | Leinonen et al. | 370/332 |

* cited by examiner

*Primary Examiner* — Nhan Le

(57) ABSTRACT

A high accuracy programmable gain amplifier has reduced temperature dependency, reduced supply voltage dependency, and supports accurate amplifier gain and accurate amplifier gain steps. The high accuracy programmable gain amplifier allows requirements compliant electronic devices to be fabricated that are capable of providing improved operational performance with less power consumption, hence extended battery life and improved operational availability. Electronic devices that incorporate the high accuracy programmable gain amplifier described below, may experience reduced variations in operational performance resulting in a reduced need for post production calibration, reduced calibration data storage requirements, and reduced device control processor cycles for use in performing calibration operations, thereby allowing such devices to be produced at a lower cost and/or to provide users with increased operational performance and/or increased battery life and, hence, increased operational availability.

16 Claims, 7 Drawing Sheets

HIGH ACCURACY PROGRAMMABLE GAIN AMPLIFIER

INCORPORATION BY REFERENCE

This application is a divisional of U.S. application Ser. No. 12/197,764, filed on Aug. 25, 2008, which claims the benefit of U.S. Provisional Application No. 60/971,335, "HIGH ACCURACY PGA PATENT" filed by Nir Yahav on Sep. 11, 2007, both of which are incorporated herein by reference in their entireties.

BACKGROUND

Programmable gain amplifiers are used in a wide range of electronic devices to dynamically amplify a received signal in response to changing operational conditions and/or changing operational needs. For example, programmable gain amplifiers are commonly used in cellular telephone devices to dynamically amplify the power of a received signal prior to demodulation and/or to dynamically amplify the power of an outgoing signal prior to transmission in order to optimize reception and transmission between multiple user equipment communicating with a base station that may interfere with each other.

Programmable gain amplifiers may be designed to support one or more gain steps that may be dynamically selected by a device controller to apply different levels of amplification to a signal. However, conventional programmable gain amplifiers within different devices, and/or programmable gain amplifiers within the same device, may provide inconsistent gain values at the respective steps and/or may provide inconsistent increments in gain at the respective steps. Such inconsistencies may be due to variations in the respective programmable gain amplifiers due to the manufacturing process and/or changes in the operating conditions of the device, such as changes in the supply voltage applied to the device and/or changes in the temperature of the device and the like.

SUMMARY

In accordance with an embodiment of the disclosure, a high accuracy programmable gain amplifier may have reduced temperature dependency, reduced supply voltage dependency, and supports accurate amplifier gain values and accurate gain steps. The high accuracy programmable gain amplifier allows requirements compliant electronic devices to be fabricated that are capable of providing improved operational performance with less power consumption, hence extended battery life and improved operational availability.

In accordance with the disclosure, electronic devices that incorporate the high accuracy programmable gain amplifier, may experience reduced variations in operational performance resulting in a reduced need for post production calibration, reduced calibration data storage requirements, and reduced device control processor cycles for use in performing calibration operations, thereby allowing such devices to be produced at a lower cost and/or to provide users with increased operational performance and/or increased battery life and, hence, increased operational availability.

In accordance with an embodiment of the disclosure, a communication device may include a transceiver having at least one programmable gain amplifier. The programmable gain amplifier may include a current source coupled to a first voltage source, a pair of amplifying transistors coupled together and to the current source, a first plurality of load transistors coupled between a first amplifying transistor of the pair of amplifying transistors and a second voltage source, and a second plurality of load transistors coupled between a second amplifying transistor of the pair of amplifying transistors and the second voltage source. A logic circuit may provide a logic output to a gate of selected load transistors in the first plurality of load transistors and may provide a logic output to a gate of selected load transistors in the second plurality of load transistors to determine a load applied to the amplifier circuit.

One example embodiment of the high accuracy programmable gain amplifier may include a current source coupled to a first voltage source, a pair of amplifying transistors coupled together and to the current source, a first plurality of load transistors coupled between a first amplifying transistor of the pair of amplifying transistors and a second voltage source, a second plurality of load transistors coupled between a second amplifying transistor of the pair of amplifying transistors and the second voltage source, and a logic circuit coupled to the first plurality of load transistors and coupled to the second plurality of load transistors to determine a load applied to the amplifier circuit.

Another example embodiment of the high accuracy programmable gain amplifier may include a current source coupled to a first voltage source, at least one first amplifying transistor coupled to the current source, at least one second amplifying transistor coupled to the current source, at least one first load transistor coupled between the at least one first amplifying transistor and a second voltage source, and at least one second load transistor coupled between the at least one second amplifying transistor and the second voltage source, the gate of the at least one first load transistor and the gate of the at least one second load transistor coupled to the second voltage source.

One example method of transmitting a message in a mobile communication device may include, receiving a power indication from a network, providing an instruction to a plurality of transistors in an amplifier to programmably load the amplifier in response to the instruction, and transmitting the message at the programmed power.

One example method of configuring an example embodiment of the high accuracy programmable gain amplifier, may include one or more of setting a working point for the programmable gain amplifier by setting a tail current through current source to a selected value and setting a load applied to the amplifier based on a logic output generated by the logic circuit.

BRIEF DESCRIPTION OF THE DRAWINGS

Example embodiments of a high accuracy programmable gain amplifier will be described with reference to the following drawings, wherein like numerals designate like elements, and wherein.

DETAILED DESCRIPTION OF EMBODIMENTS

Figure 1:
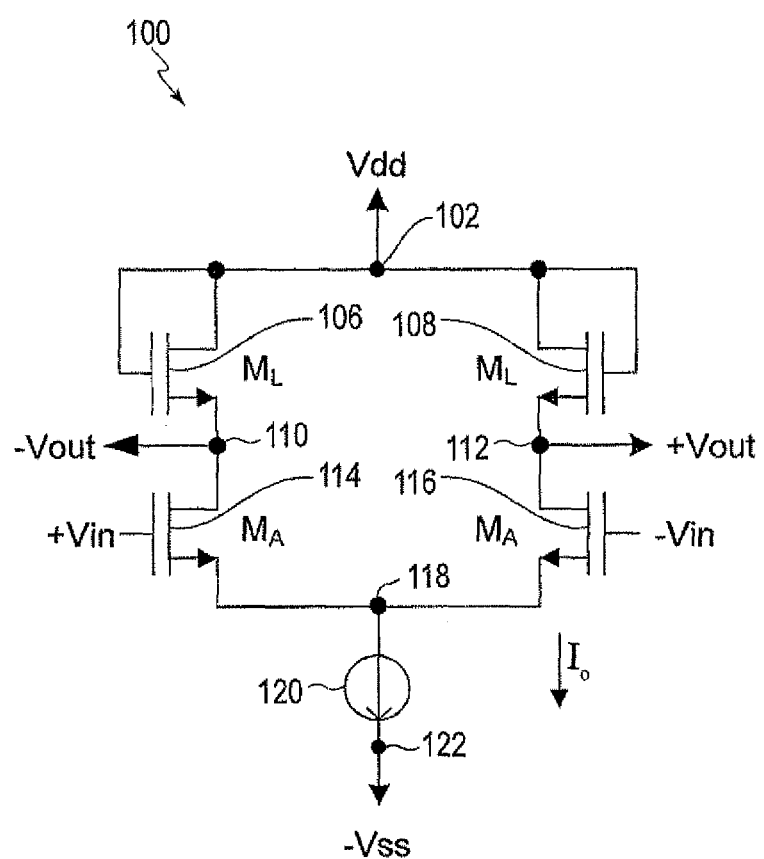
FIG. 1 is a circuit diagram of an example of a static high accuracy gain amplifier.

FIG. 1 is a circuit diagram of an example of a static high accuracy gain amplifier 100 in accordance with an embodiment of the invention. Static high accuracy gain amplifier 100 is configured to generate a differential output from an input and may include a node 102 connected to a HIGH voltage source Vdd, a first load transistor 106, a second load transistor 108, a node 110 at which an output signal −Vout is produced, a node 112 at which an output signal +Vout is produced, a first amplifying transistor 114 with a gate at which an input signal +Vin is applied, a second amplifying transistor 116 with a gate at which an input signal −Vin is applied, a current source 120, shown as a fixed current source but which may be a variable current source (not shown), and a node 122 connected to a LOW voltage source −Vss.

As shown in FIG. 1, the drain and gate of first load transistor 106 may be connected to node 102, the source of first load transistor 106 may be connected to node 110, the drain of first amplifying transistor 114 may be connected to node 110, the source of first amplifying transistor 114 may be connected to node 118, current source 120 may couple node 118 and node 122, the drain and gate of second load transistor 108 may be connected to node 102, the source of second load transistor 108 may be connected to node 112, the drain of second amplifying transistor 116 may be connected to node 112, the source of second amplifying transistor 116 may be connected to node 118.

By using transistor elements to provide amplifier loads $M_L$, static high accuracy gain amplifier 100 may improve gain consistency among individual programmable gain differential amplifiers produced on a production line by avoiding difficulties associated with consistently producing identical load resistor elements. For example, production line variations in such load resistors within a single device, or among different devices, may be due to inconsistencies in the material from which the respective resistor elements are formed, and/or structural inconsistencies in the respective resistors due to, for example, differences in the temperature and/or other characteristics of the base material at the respective load resistor locations. Variations in the load resistors within devices produced by a production line may be influenced by, among other causes, changes in the ambient temperature of the production line environment when the respective devices are made.

Further, by using transistor elements to provide amplifier loads $M_L$, static high accuracy gain amplifier 100 may improve the operational stability of devices using such amplifiers by making the devices more temperature stable. For example, in a device that uses resistor elements to provide amplifier loads $M_L$ the impedance of the load resistors used in the respective programmable gain differential amplifiers within the device may vary with an operating temperature of the device. Therefore, as the operating temperature of an operational device in which such programmable gain differential amplifiers are used changes, so may the impedance of the respective resistors, and hence the gain of the respective amplifiers in which the resistors are used. Therefore, by replacing temperature sensitive resistor units with transistor elements, which are operationally less sensitive to changes in temperature, static high accuracy gain amplifier 100 improves the operational stability of devices using such amplifiers by making the devices more temperature stable.

In addition, resistor elements generally have a larger physical footprint than a transistor capable of providing the same resistive load. Therefore, amplifiers that use resistor elements to provide load $M_L$, will have a larger physical footprint than amplifiers that use transistor elements to provide load $M_L$. Therefore, by using transistor elements to provide amplifier loads $M_L$, static high accuracy gain amplifier 100 is able to reduce the physical footprint of the amplifier.

By connecting the gate of first load transistor 106 and second load transistor 108 to node 102, which is connected to HIGH voltage source Vdd, first load transistor 106 and second load transistor 108 are fixed in a CLOSED state and current passes through each of the respective transistor channels. The gain parameter (K) of each of first load transistor 106 and second load transistor 108 may be determined based on the equation:

$$K = g\frac{W}{L} \qquad \text{Eq. 1}$$

Where W is the width of the transistor channel;
L is the length of the transistor channel; and
g is a parameter related to the conductance of a single square, i.e., L=W, area of the transistor channel which may be determined based on the equation:

$$g = \bar{u}_n C_{ox} \qquad \text{Eq. 2}$$

Where $\bar{u}_n$ is the average mobility of the charge carriers in the channel region; and $C_{ox}$ is oxide capacitance.

Based on the relationships defined above in Eq. 1 and Eq. 2, the magnitude of +Vout and −Vout of static high accuracy gain amplifier 100 may be determined based on the equation:

$$V_{out,diff} = \left(V_{dd} - V_{th} - \sqrt{\frac{I_0}{K_L}}\right) + 2\sqrt{\frac{K_A}{K_L}} \cdot V_{in} \qquad \text{Eq. 3}$$

Where $V_{th}$ is the threshold voltage of a load transistor;
$I_0$ is the tail current allowed to pass through the current source;
$K_A$ is the gain parameter of an amplifying transistor;
$K_L$ is the gain parameter of a load transistor; and
$V_{in}$ is the magnitude of the applied input signal voltages.

Current integrated circuit construction techniques are able to control transistor channel dimensions and charge carriers per unit surface area with high levels of precision. By employing transistors to provide a resistance load, the variability of the applied load in programmable gain amplifiers can be minimized.

As demonstrated by Eq. 1 and Eq. 2, for amplifiers with the same $C_{ox}$ and $\bar{u}_n$ the gain of the respective amplifiers depends only on the relative W/L ratios of the respective transistors included in the differential amplifier design. Further, as demonstrated by Eq. 3, gain does not depend on tail current $I_0$, whereas the working point does depend on tail current $I_o$. In addition, as a gain parameter of the respective load transistors decreases, the gain of the amplifier increases. Other benefits achieved using amplifier load transistors may include, high production accuracy and consistency, and reduced temperature dependency, resulting in a gain that is highly stable.

The example embodiment of a static high accuracy gain amplifier, described above with respect to FIG. 1, and the example embodiments of high accuracy programmable gain amplifiers described below with respect to FIG. 2 and FIG. 3, use NMOS transistors. NMOS transistors may be consistently and reliably produced using existing production techniques. Therefore, high accuracy programmable gain amplifiers constructed using NMOS load transistors in place of load resistors may avoid many of the operational instabilities associated with the programmable gain amplifiers that use resistor load elements. Further NMOS transistors have a high gate impedance and, therefore, NMOS transistor gates may be directly connected to, and driven by, relatively low power logic circuits, as described in greater detail below.

It is noted that although the examples of high accuracy gain amplifiers described above with respect to FIG. 1, FIG. 2, and FIG. 3, use NMOS transistors, implementation of high accuracy programmable gain amplifiers should not be considered to be restricted to the use of NMOS transistors. Other transistor technologies may also be used. For example, circuits similar to those described above with respect to FIG. 1, FIG. 2, and FIG. 3, may be constructed using PMOS transistors in place of the NMOS transistors shown in those example embodiments. In such a high accuracy programmable gain amplifier embodiments, each PMOS transistor may be placed in a CLOSED state by applying a LOW voltage to the PMOS transistor gate, and each PMOS transistors may be placed in an OPEN state by applying a HIGH voltage to the PMOS transistor gate. Further, the current in such example PMOS circuit embodiments may flow in a direction opposite that of the current flow described above with respect to the NMOS embodiments described above with respect to FIG. 1, FIG. 2 and FIG. 3.

Figure 2:
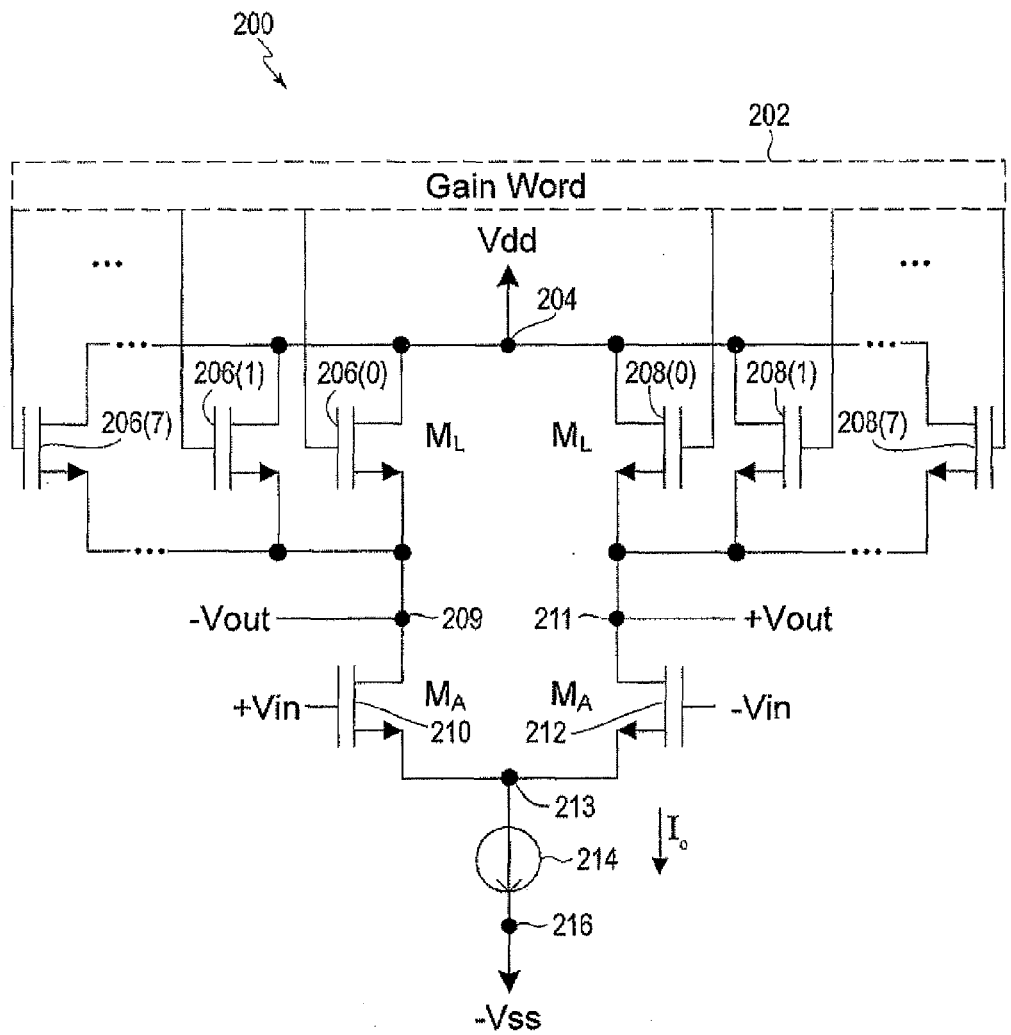
FIG. 2 is a circuit diagram of a first example of a high accuracy programmable gain amplifier.

FIG. 2 is a circuit diagram of a first example of a high accuracy programmable gain amplifier in accordance with an embodiment. As shown in FIG. 2, high accuracy programmable gain amplifier 200 may include a node 204 connected to a HIGH voltage source Vdd, a first set of individually switchable load transistors 206(0) through 206(7), a second set of individually switchable load transistors 208(0) through 208(7), a node 209 at which an output signal −Vout is produced, a node 211 at which an output signal +Vout is produced, a first amplifying transistor 210 with a gate at which an input signal +Vin is applied, a second amplifying transistor 212 with a gate at which an input signal −Vin is applied, a fixed current source 214, and a node 216 connected to a LOW voltage source −Vss.

As further shown in FIG. 2, the drain of each transistor in first set of individually switchable load transistors 206 and the drain of each transistor in second set of individually switchable load transistors 208 may be connected to node 204, the source of each transistor in first set of individually switchable load transistors 206 may be connected to node 209 and the source of each transistor in second set of individually switchable load transistors 208 may be connected to node 211, the gate of each transistor in first set of individually switchable load transistors 206 and the gate of each transistor in second set of individually switchable load transistors 208 may be connected to a logic circuit, not shown, that provides one of a HIGH and a LOW logic signal on each of the respective individually switchable load transistor gates, the drain of first amplifying transistor 210 may be connected to node 209, the source of first amplifying transistor 210 may be connected to node 213, fixed current source 214 may couple node 213 and node 216, the drain of second amplifying transistor 212 may be connected to node 211, and the source of second amplifying transistor 212 may be connected to node 213. The logic signals provided to first set of individually switchable load transistors 206 and second set of individually switchable load transistors 208 may be referred to collectively as a gain word.

The configuration of high accuracy programmable gain amplifier 200 is similar to the configuration of static high accuracy gain amplifier 100, described above with respect to FIG. 1, with the exception that first load transistor 106 has been replaced by first set of individually switchable load transistors 206 and second load transistor 108 has been replaced by second set of individually switchable load transistors 208. Therefore, the relationships described above with respect to Eq. 1, Eq. 2 and Eq. 3, described above with respect to FIG. 1, apply to high accuracy programmable gain amplifier 200.

During operation, individual load transistors within first set of individually switchable load transistors 206 and second set of individually switchable load transistors 208 may be selectably opened and closed. For example, a controller logic circuit may generate on each bit of the gain word one of a logical 1, or HIGH output which may have a voltage level equal to that of Vdd, and a logical 0, or LOW output, which may have a voltage level equal to that of 0 volts. Therefore, applying a HIGH value from the controller logic circuit on a gate of an individually switchable load transistor within first set of individually switchable load transistors 206 or on a gate of an individually switchable load transistor within second set of individually switchable load transistors 208 may CLOSE the transistor, i.e., may cause a conductive path to be formed between the transistor source and the transistor drain that connects the transistor source to Vdd, thereby dynamically connecting the transistor as a load transistor in high accuracy programmable gain amplifier 200. However, applying a LOW value from the logic circuit controller on a gate of an individually switchable load transistor within first set of individually switchable load transistors 206 or on a gate of an individually switchable load transistor within second set of individually switchable load transistors 208 may OPEN the transistor i.e., may prevent a conductive path from being formed between the transistor source and the transistor drain, thereby disconnecting the transistor source from Vdd and thereby dynamically disconnecting the transistor as a load transistor in high accuracy programmable gain amplifier 200.

Whenever several closed transistors of the same type are connected as demonstrated in FIG. 2 at 206 and 208, they act as a same type single transistor with a K that equals the sum of the respective transistor K's. Therefore, a logic circuit within a control unit for the high accuracy programmable gain amplifier may dynamically change the load transistor gain $K_L$ applied to high accuracy programmable gain amplifier 200 and, hence, may dynamically change the gain of high accuracy programmable gain amplifier 200. The load transistors in first set of individually switchable load transistors 206 may be configured in parallel between node 204 and node 209 of high accuracy programmable gain amplifier 200. Therefore, increasing the number of control bits corresponding to load transistors in first set of individually switchable load transistors 206 has the effect of increasing the gain parameter, K, between node 204 and node 209. Further, the load transistors in second set of individually switchable load transistors 208 are configured in parallel between node 204 and node 211 of high accuracy programmable gain amplifier 200. Therefore, increasing the number of control bits corresponding to load transistors in second set of individually switchable load transistors 208 has the effect of increasing the gain parameter, K, between node 204 and node 211.

In one example of high accuracy programmable gain amplifier 200, the controller logic circuit may generate a 16-bit gain word. Each of the first 8-bits, i.e., 0-7, of the gain word may be applied to a gate of each transistor in first set of individually switchable load transistors 206, i.e., transistors 206(0) through 206(7), respectively, and each of the second 8-bits, i.e., 8-15, of the gain word may be applied to a gate of each transistor in second set of individually switchable load transistors 208, i.e., transistors 208(0) through 208(7), respectively.

In one example of high accuracy programmable gain amplifier 200, each transistor in first set of individually switchable load transistors 206 and second set of individually switchable load transistors 208 have the same channel width-to-length (W/L) ratio. To maintain a balance of the load transistors in high accuracy programmable gain amplifier 200, the controller logic circuit may set at least one bit HIGH in each of first set of individually switchable load transistors 206 and second set of individually switchable load transistors 208. Further, if the controller logic circuit sets more than one bit HIGH, the controller logic circuit may set to HIGH an equal number of bits controlling gates in first set of individually switchable load transistors 206 as the number of bits controlling gates in second set of individually switchable load transistors 208. Sizing the width-to-length (W/L) ratio of transistors in each of first set of individually switchable load transistors 206 and second set of individually switchable load transistors 208 in such a manner allows high accuracy programmable gain amplifier 200 to achieve very accurate and uniform gain steps, e.g., such as a minimum gain step of −3 dB, yet allows the controller logic circuit to assure that transistor loads within high accuracy programmable gain amplifier 200 remain balanced.

In another example of high accuracy programmable gain amplifier 200, the channel width-to-length (W/L) ratio of each transistor in first set of individually switchable load transistors 206, i.e., 206(0) through 206(7) may vary, but may be configured to equal the channel width-to-length (W/L) ratio of a corresponding transistor in second set of individually switchable load transistors 208, i.e., 208(0) through 208(7). In such a configuration, in order to maintain a balance of the load transistors, if the controller logic circuit sets a first set of bits in the gain word to HIGH, e.g., control bits corresponding to the gate of load transistor 206(0), 206(1) and 206(7), the controller logic circuit may also set to HIGH, e.g., control bits corresponding to the gate of load transistor 208(0), 208(1) and 208(7). Sizing the width-to-length (W/L) ratio of transistors in each of first set of individually switchable load transistors 206 and second set of individually switchable load transistors 208 in such a manner allows high accuracy programmable gain amplifier 200 to achieve accurate gain steps, yet allows the controller logic circuit to assure that transistor loads within high accuracy programmable gain amplifier 200 remain balanced.

It is noted that, in one example embodiment, the controller logic circuit described above with respect to high accuracy programmable gain amplifier 200 may be integrated within the high accuracy programmable gain amplifier, may receive a control signal from a control unit, and may generate the gain word used to activate load transistors in a first set of individually switchable load transistors 206 and second set of individually switchable load transistors 208 based on the received control signal. In another example embodiment of a high accuracy programmable gain amplifier, the logic circuit may be integrated within a control unit that is separate from the high accuracy programmable gain amplifier, as described in greater detail below with respect to FIG. 4, and the logic circuit may transmit the gain word to high accuracy programmable gain amplifier from the separate control unit.

Figure 3:
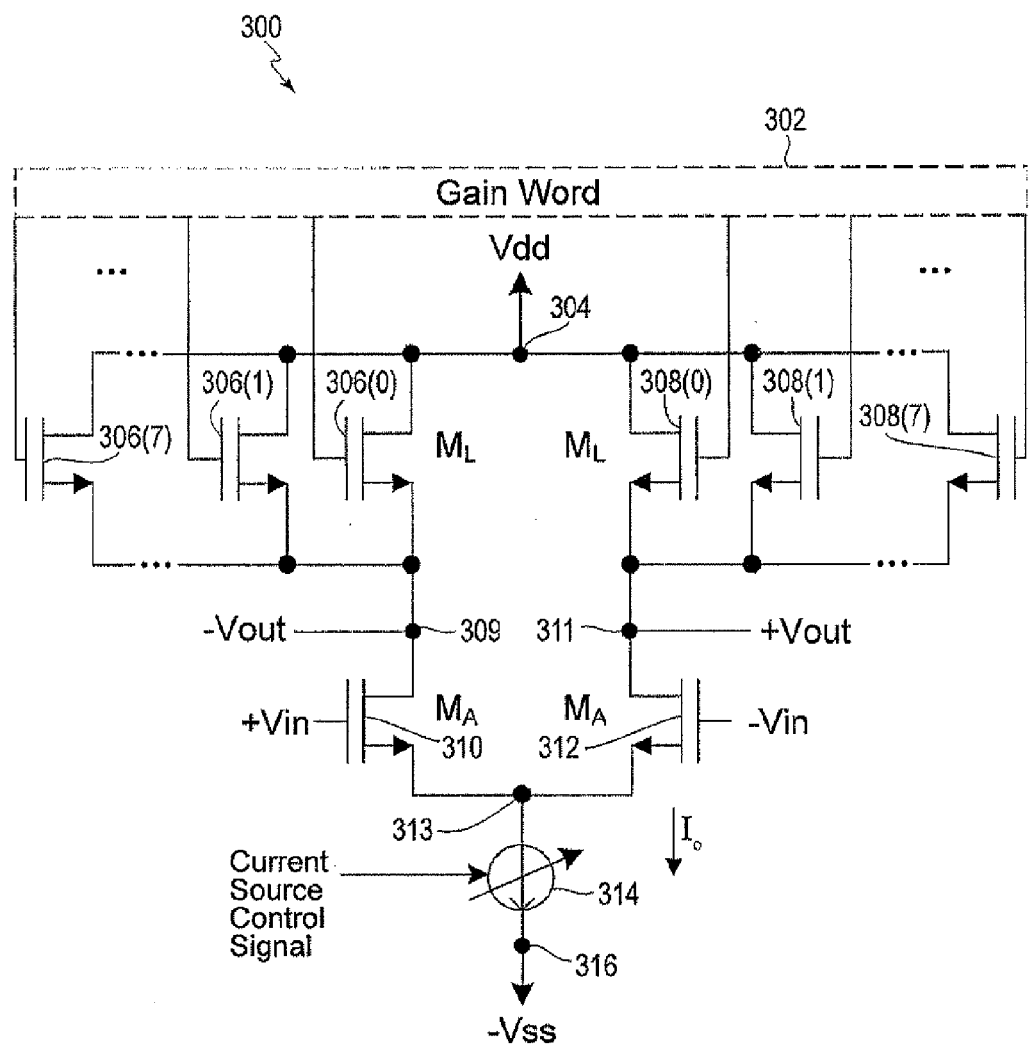
FIG. 3 is a circuit diagram of a second example of a high accuracy programmable gain amplifier.

FIG. 3 is a circuit diagram of a second example of a high accuracy programmable gain amplifier. As shown in FIG. 3, the components of high accuracy programmable gain amplifier 300 are like the components included in high accuracy programmable gain amplifier 200 described above with respect to FIG. 2. Components in FIG. 3 corresponding to components in FIG. 2 have been identified with like numeric labels, in which the only the first numeral has been changed. These components operate in the same manner as described above with respect to FIG. 2 and, therefore, will not again be described.

However, it is noted that in high accuracy programmable gain amplifier 300, the fixed current source 214 included in high accuracy programmable gain amplifier 200 has been replaced with a variable current source 314. It is further noted that, as described above with respect to Eq. 3, the working point for a high accuracy gain amplifier may be initially established by establishing an initial tail current $I_0$. Therefore, in one example of high accuracy programmable gain amplifier 300, an external control unit, described in greater detail below, may provide a current source control signal to variable current source 316. In conjunction with setting the gain, the control unit may change the working point for high accuracy programmable gain amplifier 300. Once the working point has been determined by establishing a fixed tail current, the control unit may fine tune the gain of high accuracy programmable gain amplifier 300 using the gain word, described above, to dynamically include and/or remove load transistors from high accuracy programmable gain amplifier 300, as needed, to achieve the desired gain.

Although not shown in FIG. 2 and FIG. 3, in one example embodiment, a single output from the controller logic circuit may be connected to multiple load transistor gates. Such an approach may be used to allow a dynamically controlled load value controlled by a single control bit to be constructed from multiple transistors, each transistor constructed using either the same, or different, W/L ratios. Further, such an approach may be used to allow controller logic circuit to dynamically apply a wide range of load values to an amplifier circuit using fewer control bits.

Figure 4:
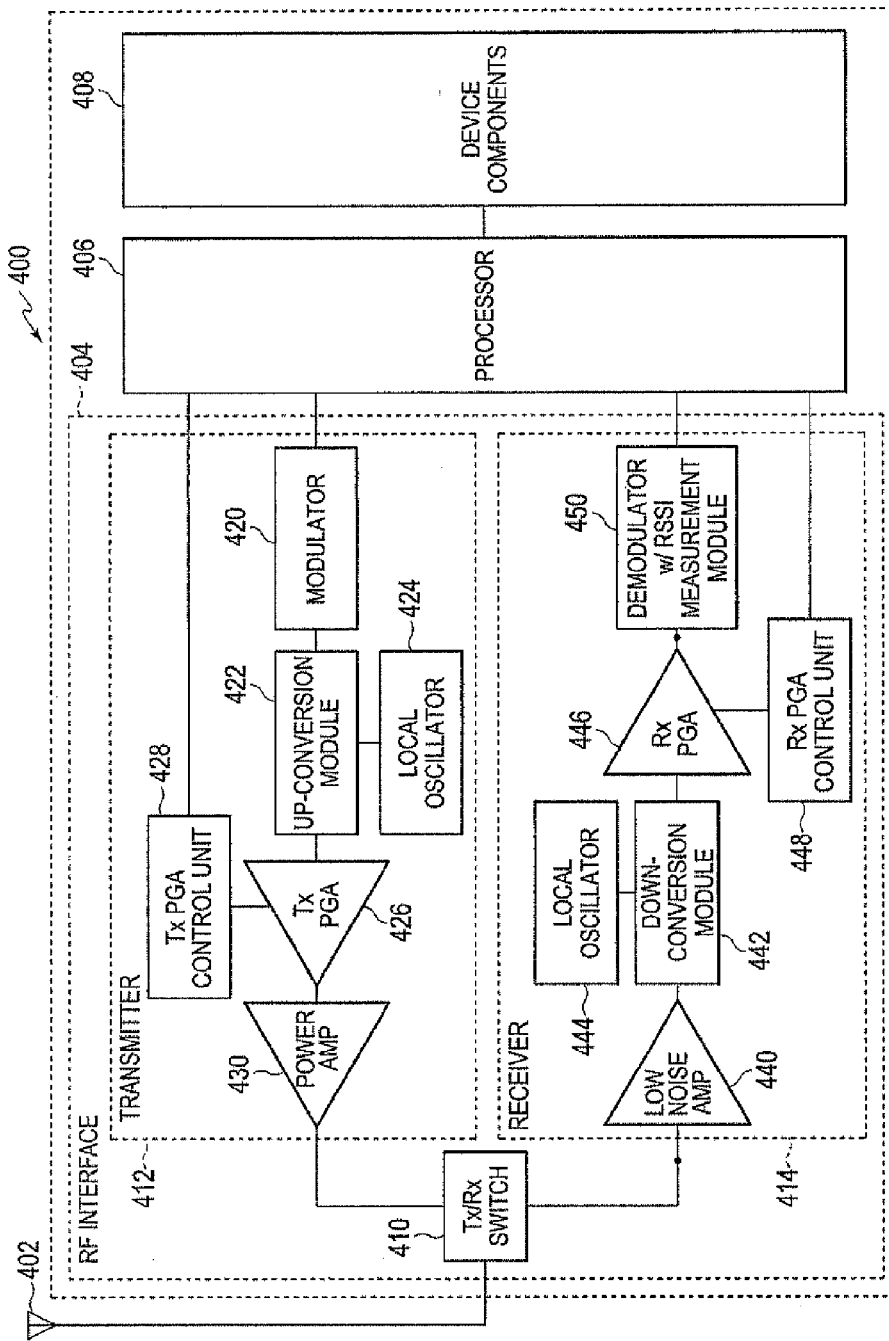
FIG. 4 is a system level block diagram of an example of an RF transceiver device that includes examples of high accuracy programmable gain amplifiers.

FIG. 4 is a system level block diagram of an example of an RF transceiver device that may include examples of high accuracy programmable gain amplifiers, for example, as described above with respect to FIG. 2 and FIG. 3. As shown in FIG. 4, RF transceiver device 400 may include an RF antenna 402, an RF interface 404, a processor 406 and device components 408. RF interface 404 may include a transceiver switch 410, a transmitter 412 and receiver 414. Transmitter 412 may include a modulator 420, an up-conversion module 422, a transmitter local oscillator 424, a transmitter high accuracy programmable gain amplifier (PGA) 426, for example, as described above with respect to FIG. 2 or FIG. 3, a transmitter PGA control unit 428 and a power amplifier 430. Receiver 414 may include a low noise amplifier 440, a down-conversion module 442, a receiver local oscillator 444, a receiver high accuracy programmable gain amplifier (PGA) 446, for example, as described above with respect to FIG. 2 or FIG. 3, a receiver PGA control unit 448, and a demodulator with RSSI measurement module 450.

As further shown in FIG. 4, device components 408 may communicate with processor 406, which may communicate with the transmitter PGA control module 428 and modulator 420 within transmitter 412, and may communicate with demodulator 450 and receiver PGA control unit 448 in receiver 414. Within transmitter 412, up-conversion module 422 may be in communication with modulator 420, local oscillator 424 and transmitter high accuracy PGA 426. Transmitter high accuracy PGA 426 may be connected with transmitter PGA control unit 428 and power amplifier 430 which may selectively connect to RF antenna 402 via transceiver switch 410. Within receiver 414, low noise amplifier 440 may selectively connect with RF antenna 402 via transceiver switch 410 and may further communicate with down-conversion module 442. Down-conversion module 442 may communicate with local oscillator 444 and receiver high accuracy PGA 446, which may communicate with receiver PGA control unit 448 and demodulator 450.

Although not shown in FIG. 4, in a typical RF transceiver device 400, device components 408 may include features such as a device memory, a rechargeable battery, and a user interface which may include a display, a keyboard, a speaker and/or microphone and a data interface unit.

In operation as a receiver, processor 406 may receive from demodulator 450 a demodulated data stream containing, for example, digitized voice data received by RF transmission from a remote transmitter, or base station, and may further receive from demodulator 450 a demodulated control data stream and an RSSI measurement of the RF signal received from the remote transmitter, or base station. Processor 406 may pass the digitized data stream to device components 408 which may process the voice data via a digital-to-analog converter and may use the generated analog signal to drive a speaker within the user interface. Further, processor 406 may process the control data stream to extract a transmission power that the processor has been instructed to use when transmitting an RF response. In addition, processor 406 may receive from device components 408, for example, digitized voice data generated by a local user via a microphone and voice digitizer included in device components 408. Processor 406 may generate and pass to modulator 420 a formatted data stream that may include a control channel data stream that includes the RSSI measurement and other control data and may further include a voice data stream that includes the digitized voice data received from device components 408.

Modulator 420 may receive the formatted digital data stream from processor 406 and may generate an analog modulated signal in accordance with a selected transmission protocol standard, e.g., CDMA, wideband-CDMA, etc., and may pass the analog modulated signal to up-conversion module 422. Up-conversion module 422 may receive the analog modulated signal at a baseband frequency and may mix the signal with a higher frequency, e.g., an RF frequency, oscillating signal generated by local oscillator 424 and may provide the RF frequency signal as input to transmitter high accuracy PGA 426.

Transmitter high accuracy PGA 426 may be a high accuracy programmable gain amplifier, for example, as described above with respect to FIG. 2 and FIG. 3, and may include dynamically configurable load transistors and a variable tail current source as described above with respect to FIG. 3. For example, transmitter high accuracy PGA 426 may be configured to maintain a gain setting based on, for example, a gain word. For example, upon receiving a transmission power assignment that is different from a previously received transmission power assignment from a remote transmitter, or base station, via a control data channel embedded in a demodulated data stream received from demodulator 450, processor 406 may pass the new power assignment to transmission PGA control unit 428. Transmission PGA control unit 428 may assess the transmission power assignment and, based on knowledge of the power of the RF signal received from up-conversion module 422, and the static amplification applied by power amp 430, and the gain ranges and gain steps supported by transmitter high accuracy PGA 426, transmission PGA control unit 428 may generate a variable current source control signal and/or a new gain word which may be passed to transmitter high accuracy PGA 426 to dynamically configure the transmitter high accuracy PGA 426 to apply an appropriate amount of gain and working point.

Once a signal is received by transmitter high accuracy PGA 426 from up-conversion module 422, the signal is amplified in accordance with settings established within transmitter high accuracy PGA 426 by transmitter PGA control unit 428, and passed to power amplifier 430. Power amplifier 430 applies a predetermined amplification to the signal received from transmitter high accuracy PGA 426 and transmits the signal via transceiver switch 410 and RF antenna 402.

In operation as a receiver, low noise amplifier 440 may receive an RF signal from antenna 402 via transceiver switch 410. Low noise amplifier 440 may amplify the received signal by a predetermined gain and may pass the amplified signal to down-conversion module 442. Down-conversion module 442 may mix the RF frequency with a signal produced by local oscillator 444 to produce a down-converted signal, and may pass the downconverted signal to receiver high accuracy PGA 446.

Receiver high accuracy PGA 446 may work in concert with demodulator 450, processor 406 and receiver PGA control unit 448. For example, demodulator 450 may inform processor 406 of bit error rates (BER), or other measure of error, being obtained by demodulator 450 in attempting to demodulate the received signal at the current signal strength received from receiver high accuracy PGA 446. If processor 406 determines that the measure of error are acceptable, processor 406 may do nothing, and receiver high accuracy PGA 446 may continue to amplify the down-converted signal in accordance with current control setting established and maintained by receiver PGA control unit 448 in response to a previous instruction from processor 406. However, if processor 406 determines that measure of error may be improved, processor 406 may instruct receiver PGA control unit 448 to increase the amplification applied by receiver high accuracy PGA 446. In response, receiver PGA control unit 448 may assess the incremental gain requested by processor 406 and, based on knowledge of the working point and gain steps supported by transmitter high accuracy PGA 426, transmission PGA control unit 428 may generate a new gain word and variable current source control signal which may be passed to receiver PGA 426 to dynamically reconfigure the transmitter high accuracy PGA 426 to apply a corresponding incremental amount of gain and a corresponding working point.

Further, demodulator 450, with the assistance of, for example, an integrated RSSI measurement module, may determine the power of the amplified signal received from receiver high accuracy PGA 446. Once the power of the signal received at demodulator 450 is determined, the RSSI measurement module within demodulator 450 may determine the signal strength of the original RF signal received by antenna 402, and may pass the determined RSSI value to processor 406. The RSSI measurement module may determine the signal strength of the original RF signal received by antenna 402 by adjusting a measure of the power of the signal received at demodulator 450 by a switch loss at transceiver switch 410, the amount of gain applied by low noise amplifier 440, and the amount of gain applied by receiver high accuracy PGA 446. For example, the amount of gain applied by receiver high accuracy PGA 446 may be obtained from receiver PGA control unit 448 via processor 406. Processor 406 may, in turn report the RSSI value to the base station and/or other RF device with which RF transceiver device 400 is communicating via a next RF transmission.

Figure 5:
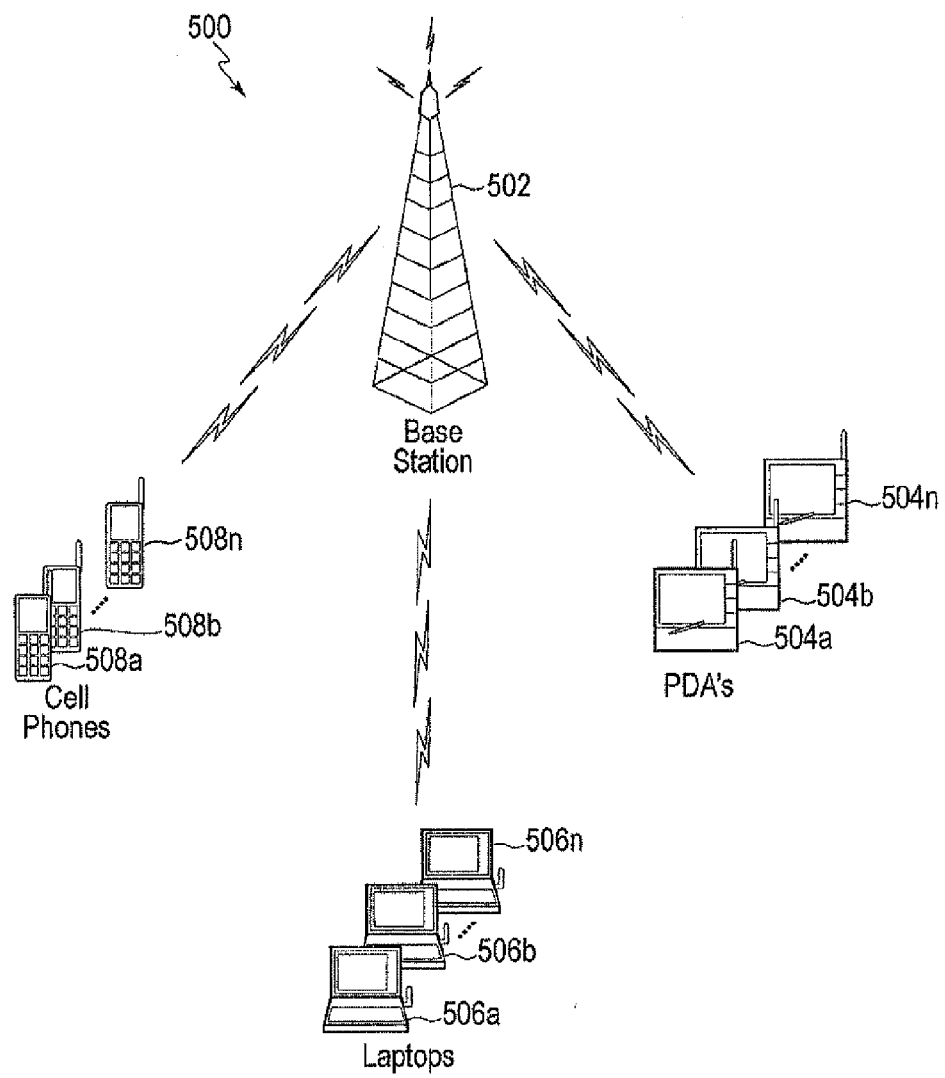
FIG. 5 is a schematic diagram of a transmission system that includes RF transceiver devices that include examples of high accuracy programmable gain amplifiers.

FIG. 5 is a schematic diagram of a transmission system that includes RF transceiver devices that may include high accuracy programmable gain amplifiers, as described above, and which may support transmit power control (TPC) enabled protocols such as global system for mobile communications (GSM), code division multiple access (CDMA), and wideband CDMA (W-CDMA). As shown in FIG. 5, a base station may support indirect communication between a number of RF transmitter received devices. Such communication may include voice and/or data communication between any number of RF enabled devices, such as, cell phones 508(a-n), RF interface enabled laptops 506(a-n) and RF interface enabled personal digital assistants 504(a-n) and/or between any number of other RF enabled devices. Each of the RF enabled device shown in FIG. 5 may include high accuracy programmable gain amplifiers, such as those described above with respect to FIG. 2 through FIG. 4, and may include transceiver components such as those described above with respect to FIG. 4.

Although not shown in FIG. 5, base station 502 may include connections to other base stations, thereby allowing the respective transceiver devices to communicate with other devices not shown in FIG. 5, such as non-RF enabled devices capable of establishing a communication path to base station 502. Further, although not shown in FIG. 5, RF enabled devices may use high accuracy programmable gain amplifiers embedded within the respective devices, and/or the techniques described above, to support peer-to-peer communication between RF enabled devices that support a common transmission protocol.

Figure 6:
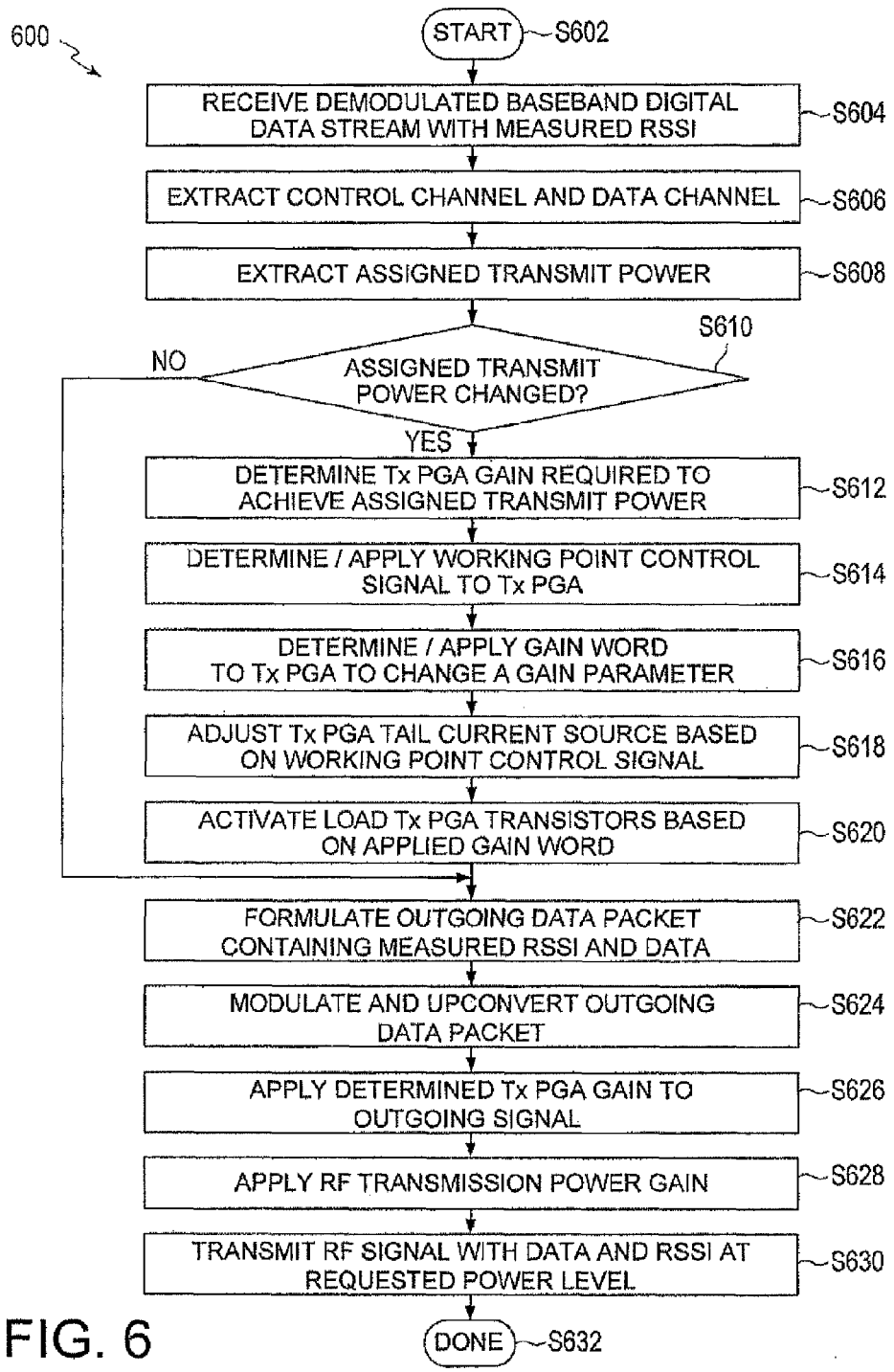
FIG. 6 shows a flow-chart of a process for generating a transmit power control compliant RF signal by an RF transceiver device that includes examples of high accuracy programmable gain amplifiers.

FIG. 6 shows a flow-chart of an example of a process for the generation and transmission of a TPC compliant RF signal by an RF transceiver device, such as the example RF transceiver device described above with respect to FIG. 4, that includes a high accuracy programmable gain amplifier in the transmission path. As shown in FIG. 6, operation of the method begins at step S602 and proceeds to step S604.

In step S604, a transceiver device processor may receive a demodulated data stream with a measured RSSI value, and operation of the method continues to step S606.

In step S606, the transceiver device processor may extract a control channel and a data channel from the received digital data stream, and operation of the method continues to step S608.

In step S608, the transceiver device processor may extract from the control channel a transmit power assigned, for example, by a base station with which the transceiver device may be communicating, and operation of the method continues to step S610.

If, in step S610, the transceiver device processor determines that the assigned transmit power has changed, operation of the method continues to step S612, otherwise, operation of the method continues to step S622.

In step S612, the transceiver device processor may determine a transmission gain that should be applied by the transmitter high accuracy PGA so that the RF signal emitted from the transmitter is emitted at the assigned transmit power and may instruct the transmitter high accuracy PGA control unit to configure the transmitter high accuracy PGA to apply such a gain to outgoing signals, and operation of the method continues to step S614.

In step S614, the transmitter high accuracy PGA control unit may determine and apply to the transmitter high accuracy PGA an adjusted working point control signal, and operation of the method continues to step S616.

In step S616, the transmitter high accuracy PGA control unit may determine and apply to the transmitter high accuracy PGA an adjusted gain word to change a gain parameter, and operation of the method continues to step S618.

In step S618, the transmitter high accuracy PGA may adjust the tail current source based on the received working point control signal, and operation of the method continues to step S620.

In step S620, the transmitter high accuracy PGA may activate/deactivate load transistors based on the received gain word, and operation of the method continues to step S622.

In step S622, the transceiver device processor, having determined that the transmitter high accuracy PGA is configured to apply the appropriate PGA gain, may formulate an outgoing data packet containing the measured RSSI value and outgoing data and pass the data packet to the transmitter, and operation of the method continues to step S624.

In step S624, the transmitter may modulate and up-convert the received data packet and pass the resulting modulated, up-converted analog signal to the transmitter high accuracy PGA, and operation of the method continues to step S626.

In step S626, the transmitter high accuracy PGA may apply to the outgoing analog signal the PGA gain that the transmitter high accuracy PGA has been configured to apply, and may pass the amplified signal to the power amplifier, and operation of the method continues to step S628.

In step S628, the power amplifier may apply a predetermined RF transmission gain to the outgoing analog signal and pass the amplified RF signal to the RF antenna via the transmission/receiver switch, and operation of the method continues to step S630.

In step S630, the RF signal may be transmitted from the antenna with data and measure RSSI value at the requested power level, and operation of the method terminates at step S632.

Figure 7:
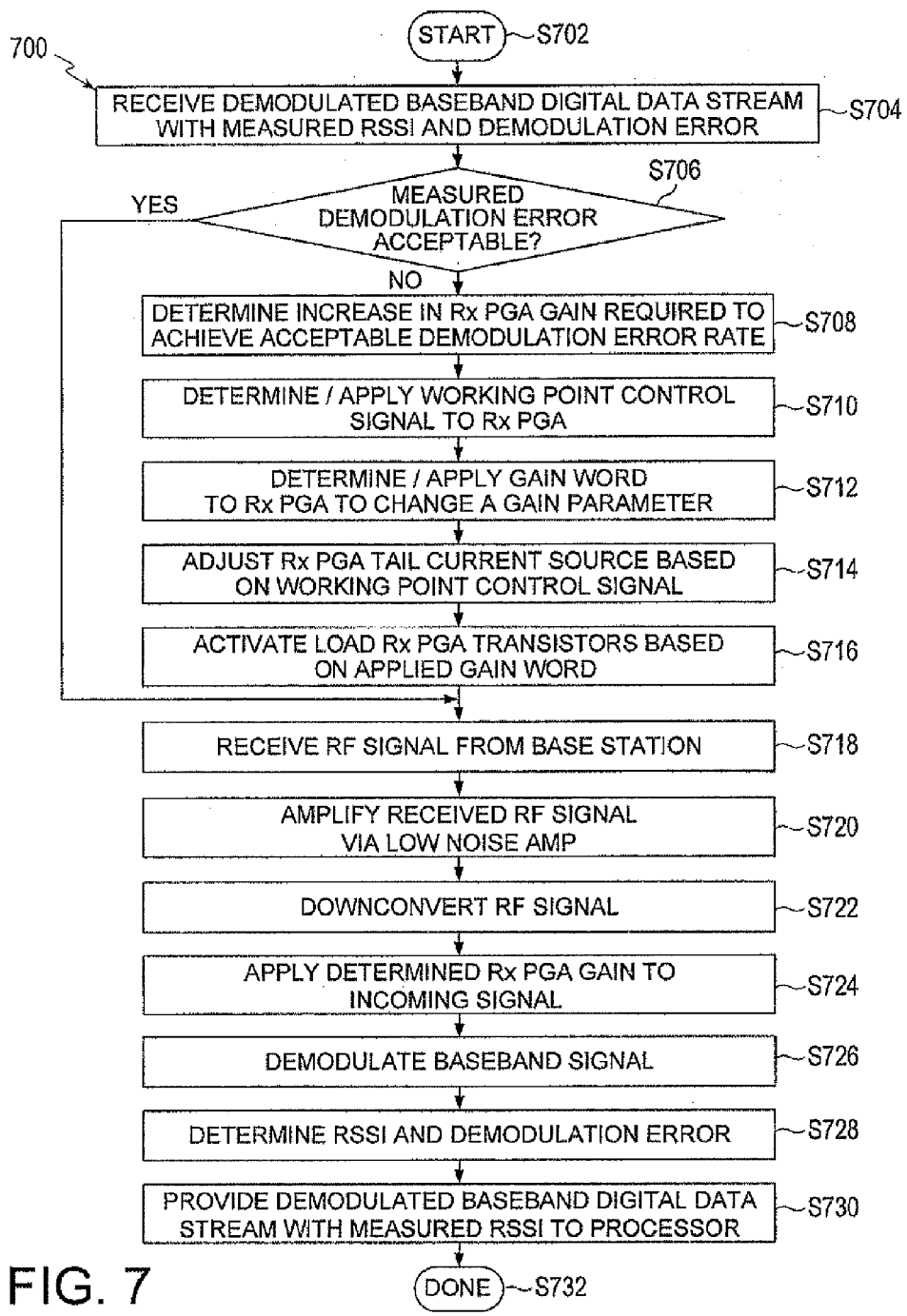
FIG. 7 shows a flow-chart of a process for receiving a transmit power control compliant RF signal by an RF transceiver device that includes examples of high accuracy programmable gain amplifiers.

FIG. 7 shows a flow-chart of an example of a process for receiving a TPC compliant RF signal by an RF transceiver device, such as the example RF transceiver device described above with respect to FIG. 5, that includes a high accuracy programmable gain amplifier in the receiver path. As shown in FIG. 7, operation of the method begins at step S702 and proceeds to step S704.

In step S704, a transceiver device processor may receive a demodulated data stream with a measured RSSI value and a measure of demodulation error, e.g., such as bit error rate (BER), etc., and operation of the method continues to step S706.

If, in step S706, the transceiver device processor determines that the demodulation error rate is acceptable, operation of the method continues to step S718, otherwise, operation of the method continues to step S708.

In step S708, the transceiver device processor may determine an increase in the receiver high accuracy PGA gain required to achieve an acceptable demodulation error rate and may communicate the determined increase in PGA gain to the receiver high accuracy PGA control unit, and operation of the method continues to step S710.

In step S710, the receiver high accuracy PGA control unit may determine and apply to the receiver high accuracy PGA an adjusted working point control signal, and operation of the method continues to step S712.

In step S712, the receiver high accuracy PGA control unit may determine and apply to the receiver high accuracy PGA an adjusted gain word to change a gain parameter, and operation of the method continues to step S714.

In step S714, the receiver high accuracy PGA may adjust the tail current source based on the received working point control signal, and operation of the method continues to step S716.

In step S716, the receiver high accuracy PGA may activate/deactivate load transistors based on the received gain word, and operation of the method continues to step S718.

In step S718, the transceiver device may proceed to receive, via the transceiver device antenna, an RF signal from a remote transceiver device with which the transceiver device is communicating, such as a base station, and operation of the method continues to step S720.

In step S720, the receiver low noise amplifier may amplify the received RF signal and may pass the amplified signal to the down-conversion module, and operation of the method continues to step S722.

In step S722, the receiver down-conversion module may down-convert the amplified RF signal and may pass down-converted signal to the receiver high accuracy PGA, and operation of the method continues to step S724.

In step S724, the receiver high accuracy PGA may apply to the incoming down-converted analog signal the PGA gain that the receiver high accuracy PGA has been configured to apply, and may pass the amplified signal to the receiver demodulator, and operation of the method continues to step S726.

In step S726, the receiver demodulator may demodulate the analog signal to produce a demodulated data stream, and operation of the method continues to step S728.

In step S728, the receiver demodulator may determine an RSSI value for the received demodulate the analog signal and a demodulation error for the demodulated data stream, and operation of the method continues to step S730.

In step S730, the receiver demodulator may provide the demodulated data stream with RSSI value and demodulation error to the transceiver processor, and operation of the method terminates at step S732.

It is noted that that the described high accuracy programmable gain amplifier may be used to amplify any signal with accurate gain and that use of the high accuracy programmable gain amplifier is not limited to use in RF transceiver devices, but may be used in any device in which accurate analog and RF signal amplification is desired.

It is noted that embodiments of the described high accuracy programmable gain amplifier may include modifications in the amplifier topology. For example, one example embodiment of the described high accuracy programmable gain amplifier that includes modification in the amplifier topology may include interstage circuitry coupled between the described amplifying transistors and the described load transistors. For example, such an embodiment may include a first interstage circuit component coupled between the first plurality of load transistors and the first amplifying transistor of the pair of amplifying transistors; and may include a second interstage circuit component coupled between the second plurality of load transistors and the second amplifying transistor of the pair of amplifying transistors.

For purposes of explanation, in the above description, numerous specific details are set forth in order to provide a thorough understanding of the high accuracy programmable gain amplifiers and use of the high accuracy programmable gain amplifiers within RF transceiver devices in support of RF based communication. It will be apparent, however, to one skilled in the art that the high accuracy programmable gain amplifier may be practiced without these specific details. In other instances, well-known structures and devices are shown in block diagram form in order to avoid obscuring the features of the high accuracy programmable gain amplifiers and the RF transceiver devices in which the high accuracy programmable gain amplifier may be used.

While the high accuracy programmable gain amplifier has been described in conjunction with the specific embodiments thereof, it is evident that many alternatives, modifications, and variations will be apparent to those skilled in the art. Accordingly, embodiments of the high accuracy programmable gain amplifier as set forth herein are intended to be illustrative, not limiting. There are changes that may be made without departing from the spirit and scope of the invention.

What is claimed is:

1. A method for transmitting a message in a mobile communication device, comprising:
   receiving a power indication from a network;
   providing an instruction based on the power indication to an amplifier having a plurality of transistors, the instruction being defined by a plurality of control bits that are generated by a logic circuit coupled with the amplifier;
   programmably loading the amplifier in response to the instruction so that a first group of the plurality of transistors is placed in a CLOSED state by a first output of the logic circuit; and
   transmitting the message at a programmed power.

2. The method of claim 1, wherein the instruction controls a gain of the transmitted message.

3. The method of claim 1, wherein the instruction controls switching of the plurality of transistors.

4. The method of claim 1, wherein a second group of the plurality of transistors is placed in a CLOSED state by a second output of the logic circuit.

5. The method of claim 4, wherein the number of transistors in the first group is the same as the number of transistors in the second group.

6. The method of claim 1, further comprising:
   supplying a constant current to the amplifier.

7. The method of claim 1, further comprising:
   supplying a variable current to the amplifier.

8. The method of claim 7, wherein controlling the variable current sets the amplifier to a working point.

9. A mobile communication device in a network, comprising:
   a receiver configured to receive a power indication from the network;
   an amplifier configured to provide an instruction based on the power indication to a plurality of transistors in the amplifier to programmably load the amplifier, the instruction being defined by a plurality of control bits that are generated by a logic circuit coupled with the amplifier, and causing a first group of the plurality of transistors to be in a CLOSED state, when the output of the logic circuit is a first output; and
   a transmitter configured to transmit a message at a programmed power.

10. The mobile communication device of claim 9, wherein the instruction controls a gain of the transmitted message.

11. The mobile communication device of claim 9, wherein the instruction controls switching of the plurality of transistors.

12. The mobile communication device of claim 9, wherein a second group of the transistors is placed in a CLOSED state by a second output of the logic circuit.

13. The mobile communication device of claim 12, wherein the number of transistors in the first group is the same as the number of transistors in the second group.

14. The mobile communication device of claim 9, further comprising:
   a constant current source configured to supply a constant current to the amplifier.

15. The mobile communication device of claim 9, further comprising:

a variable current source configured to supply a variable current to the amplifier.

16. The mobile communication device of claim 15, wherein controlling the variable current source sets the amplifier to a working point.

* * * * *